US008591709B1

(12) United States Patent
Lim et al.

(10) Patent No.: US 8,591,709 B1
(45) Date of Patent: Nov. 26, 2013

(54) SPUTTER DEPOSITION SHIELD ASSEMBLY TO REDUCE CATHODE SHORTING

(75) Inventors: Chichoy Lim, Sg. Ara (MY); Eang Keong Tan, Sungai Dua (MY); Weng Aun Teh, Teluk Kumbar (MY); Yi Chun Tan, Gelugor (MY); Sheik Chian Lee, Pmtg Pauh (MY)

(73) Assignee: WD Media, LLC, San Jose, CA (US)

( * ) Notice: Subject to any disclaimer, the term of this patent is extended or adjusted under 35 U.S.C. 154(b) by 584 days.

(21) Appl. No.: 12/782,662

(22) Filed: May 18, 2010

(51) Int. Cl.
*C23C 14/04* (2006.01)

(52) U.S. Cl.
USPC ............ 204/298.11; 204/298.07; 204/298.01; 118/715; 118/723 R; 156/345.3; 427/58; 360/110

(58) Field of Classification Search
USPC .................................................... 204/298.11
See application file for complete search history.

(56) References Cited

U.S. PATENT DOCUMENTS

| | | | |
|---|---|---|---|
| 3,955,118 A | 5/1976 | Flemming | |
| 5,667,650 A * | 9/1997 | Face et al. | 204/298.07 |
| 5,885,358 A * | 3/1999 | Maydan et al. | 118/723 R |
| 6,149,784 A | 11/2000 | Su et al. | |
| 6,248,176 B1 | 6/2001 | Yudovsky et al. | |
| 6,398,929 B1 | 6/2002 | Chiang et al. | |
| 6,471,831 B2 | 10/2002 | Lu et al. | |
| 6,676,812 B2 | 1/2004 | Chung | |
| 6,682,635 B2 | 1/2004 | Bichler et al. | |
| 6,709,556 B2 | 3/2004 | Green | |
| 6,730,174 B2 * | 5/2004 | Liu et al. | 118/715 |
| 6,780,294 B1 | 8/2004 | Hixson et al. | |
| 7,001,491 B2 | 2/2006 | Lombardi et al. | |
| 7,041,201 B2 | 5/2006 | Gung et al. | |
| 7,294,245 B2 | 11/2007 | Fu | |
| 7,569,125 B2 | 8/2009 | Gung et al. | |
| 2002/0139665 A1 * | 10/2002 | DeOrnellas et al. | 204/298.01 |
| 2003/0150720 A1 * | 8/2003 | Green | 204/298.07 |
| 2003/0168168 A1 * | 9/2003 | Liu et al. | 156/345.3 |
| 2004/0031680 A1 * | 2/2004 | Miller et al. | 204/298.11 |
| 2006/0032741 A1 | 2/2006 | Lawson et al. | |
| 2007/0227882 A1 | 10/2007 | Trassl et al. | |
| 2008/0237496 A1 | 10/2008 | Gupta | |
| 2010/0055298 A1 * | 3/2010 | Sommers et al. | 427/58 |
| 2010/0128390 A1 * | 5/2010 | Tanaka | 360/110 |

* cited by examiner

*Primary Examiner* — Keith Hendricks
*Assistant Examiner* — Timon Wanga

(57) ABSTRACT

A shield assembly for a sputter deposition chamber, the shield assembly including an outer sleeve with a gas inlet to conduct a gas through the outer sleeve and an inner sleeve disposed within the outer sleeve, the inner sleeve including gas channels on a surface mating with the outer sleeve to conduct the gas between the inner and outer sleeves. The shield assembly may further include an aperture ring adjacent to a first end of both the inner and outer sleeves, the aperture ring including a plurality of gas outlets to conduct the gas from the gas channels and an inner aperture flange extending from the plurality of gas outlets and adjacent to gas shield flange to form a gas runway for conducting the gas toward a sputter target located within the deposition chamber.

20 Claims, 6 Drawing Sheets

SPUTTER DEPOSITION SHIELD ASSEMBLY TO REDUCE CATHODE SHORTING

TECHNICAL FIELD

Embodiments of the invention described herein relate to the field of sputter deposition and more specifically to gas distribution within a sputter chamber configured for reactive deposition of layers for magnetic recording media.

BACKGROUND

In a physical vapor deposition (PVD), or sputtering, chamber, a working gas is introduced through an aperture in the chamber to sputter target material onto a workpiece, such as a magnetic recording media substrate. In so-called reactive sputtering chambers, the working gas includes a species which chemically reacts with the sputter target material. For example, in the manufacture of magnetic disk drives, oxygen content in the sputter target for a recording layer may be supplemented with a reactive working gas including oxygen to help create grain insulation within the magnetic media layer.

During such reactive sputtering processes however, the oxygen gas may react within the chamber to form a particle at the aperture which can grow larger until the aperture is bridged to the target/cathode causing a short circuit and shutting down the sputtering chamber. Such a short between the aperture and target necessitates a chamber clean and/or hardware kit change and incurs lost manufacturing down time and reduced equipment utilization.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth, such as dimensional quantities, to provide a thorough understanding of exemplary embodiments of the present invention. It will be apparent, however, to one skilled in the art that these specific details need not be employed to practice all embodiments of the present invention. Also, well known components or methods have not been described in detail to avoid unnecessarily obscuring various embodiments of the present invention.

Generally, described herein are embodiments of shield assemblies, deposition chambers, and deposition systems. Embodiments of the shield assemblies provide a reactive gas flow that is away from the aperture surface and may be made laminar out from between the aperture and a center shield disposed around a workpiece to be coated with the sputtered material. As such, the shield assemblies, deposition chambers and deposition systems described herein reduce the occurrence of particle formation at the reactive gas aperture and reduce occurrences of cathode shorting to increase manufacturing uptime and equipment utilization.

It should be noted that the apparatus and methods discussed herein may be used with various types of sputter deposition systems and processes. In the exemplary embodiments, for example, the shield assemblies, deposition chambers, and deposition systems discussed herein are employed for depositing media layers on a magnetic recording disk. Alternatively, the shield assemblies, deposition chambers and deposition systems discussed herein may be used with other types of material depositions, for example as used in the microelectronics industry.

Figure 1:
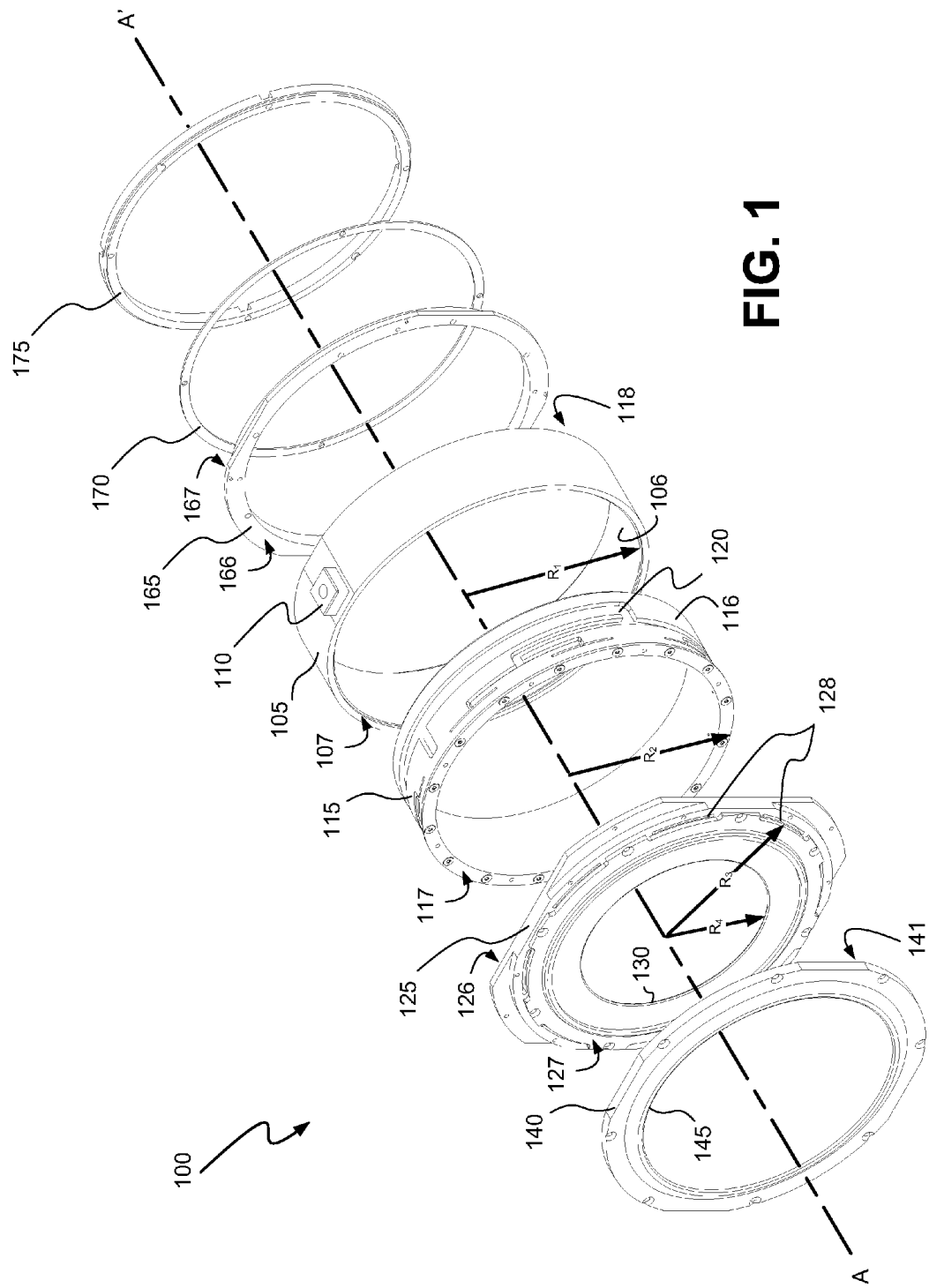
FIG. 1 illustrates an exploded isometric view of a shield assembly for a sputter deposition system, in accordance with an embodiment of the present invention.

FIG. 1 illustrates an exploded isometric view of a shield assembly 100 for a sputter deposition system, in accordance with an embodiment of the present invention. The shield assembly 100 includes an outer sleeve 105 having cylindrical surfaces surrounding a longitudinal axis A-A' and spanning a length along the longitudinal axis A-A'. The outer sleeve 105 has two opposing open ends and is fitted with a gas inlet 110 to conduct a gas in a radial direction through the cylindrical surface of outer sleeve 105.

The shield assembly 100 further includes an inner sleeve 115 sized to have an outer diameter (radius $R_2*2$) smaller than an inner diameter (radius $R_1*2$) of the outer sleeve 105 so that the inner sleeve 115 may be disposed within the outer sleeve 105 such that an inner sleeve outer surface 116 is adjacent to and facing an outer sleeve inner surface 106. The inner diameter of the inner sleeve 115 is further sized to surround an outer diameter of a sputter target, which is a function of the particular sputter deposition chamber utilized and/or sputter process performed within a given sputter deposition chamber.

Figure 2:
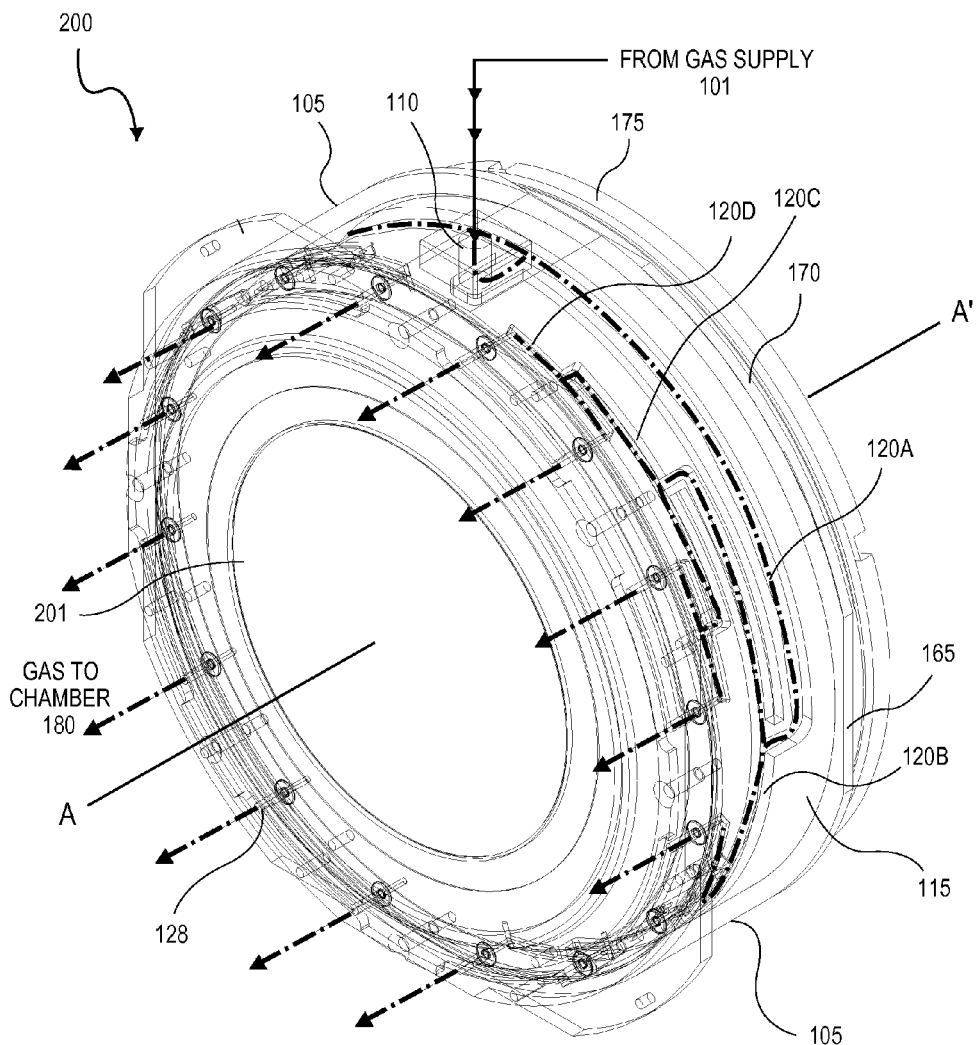
FIG. 2 illustrates an isometric view of the shield assembly depicted in FIG. 1, in accordance with an embodiment.

In an embodiment, the inner sleeve 115 includes gas channels 120 on the inner sleeve outer surface 116 to conduct the gas between the inner and outer sleeves 115, 105. In one particular embodiment, the gas channels 120 are machined into the inner sleeve outer surface 116 to form a one-to-many manifold which uniformly distributes gas received at the gas inlet 110 to a plurality of gas outlets positioned at different angular positions about a first inner sleeve end face 117. The outer sleeve inner surface 106 may be similarly formed with gas channels. FIG. 2 illustrates an isometric view of the shield assembly depicted in FIG. 1, assembled around a sputter target 201 to form a target and shield assembly 200 in accordance with an embodiment. FIG. 2 further illustrates the gas flow through the assembly during a sputter deposition process. The gas from a first gas supply 101 is introduced at the gas inlet 110 and passes in a radial direction through the outer sleeve 106. The gas is then conducted both circumferentially and longitudinally between outer sleeve inner surface 106 and the inner sleeve outer surface 116 to be outlet in a chamber region 180, as described further elsewhere herein.

The exemplary gas channels 120 illustrated in FIG. 2 have a binary branching arrangement with two upper level branches formed from each lower level branch. In a further embodiment each level of the branching arrangement has a smaller channel size than the level below. In one such embodiment the cross-section dimension of each level of channels is equal to approximately one half the cross-sectional dimension of the level below to maintain approximately cumulative flow rate for each level of channel branching. For example, two first level gas channels 120A extended in opposite directions from the gas inlet 110 along approximately ¼ the nominal circumference of the inner sleeve 115. Two second level gas channels 120B then extend in opposite directions from each of the two first level gas channels 120A along approximately ⅛ the nominal circumference of the inner sleeve 115. Two third level gas channels 120C then extend in opposite directions from each of the four second level gas channels 120B along approximately 1/16 the nominal circumference of the inner sleeve 115. Two fourth level gas channels 120D then extend in opposite directions from each of the eight third level gas channels 120C along approximately 1/32 the nominal circumference of the inner sleeve 115 such that sixteen end points of the gas channels 120 are substantially equally spaced apart by an angular distance approximately equal 1/16 the nominal circumference of the inner sleeve 115.

Figure 3:
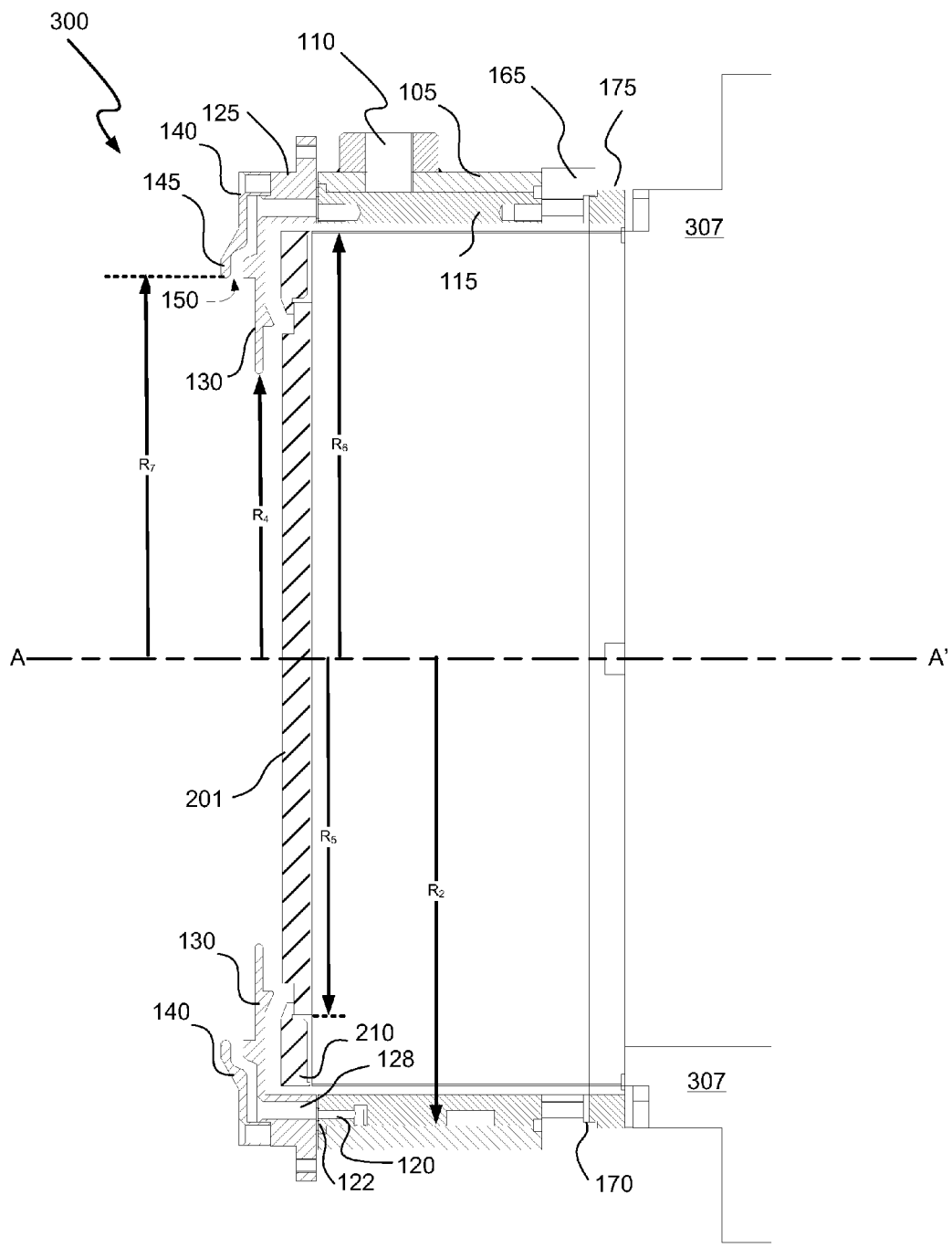
FIG. 3 illustrates a cross-sectional view of the shield assembly depicted in FIG. 1 taken along the longitudinal axis of the assembly, in accordance with an embodiment.

Returning to FIG. 1, the shield assembly 100 further includes an aperture ring 125 having a first face 126 adjacent to the first inner sleeve end face 117 and a first outer sleeve end face 107. Depending on the embodiment, the aperture ring 125 may either abut both the inner and outer sleeve faces 117, 107 or alternatively, an intervening member, such as a crush washer, may be disposed between the first face 126 and either or both of the sleeve faces 117, 107. FIG. 3 illustrates a cross-sectional view taken along the longitudinal axis A-A' of the shield assembly depicted in FIG. 1, assembled into a sputter chamber assembly 300 in accordance with an embodiment. As shown in FIG. 3, a shim 122 is disposed between the aperture ring 125 and the inner and outer sleeves 115, 105. A shim 122 may be in the form of a single ring with a plurality of openings punched in ring at angular positions corresponding to the outlets of the gas channels 120 or one of a plurality of shims 122 may be utilized with each shim positioned at the outlets of the gas channels 120. The shim 122 may comprise any material convention in the art for sealing machined surface to form a gas tight fitting. In a preferred embodiment, the shim 122 is metallic. For example, where aluminum is selected for the aperture ring 125 and inner/outer sleeves 115, 105, a soft metal, such as copper, having a nominal thickness of approximately 0.8 mm was found to provide a gas-tight seal at the union between the gas channels 120 and a plurality of gas outlets 128 formed in the aperture ring 125.

As shown in FIGS. 1 and 2, the gas outlets 128 are disposed at different angular positions of the aperture ring 125 to conduct the gas from the gas channels 120. The plurality of gas outlets 128 are disposed at a radial distance $R_3$ to be in alignment with the gas channels 120 positioned about the first inner sleeve end face 117. In an embodiment, the plurality of gas outlets 128 is even spaced apart such that the angular spacing between adjacent ones of the plurality is approximately equal across the plurality. In one embodiment, the plurality of gas outlets 128 are through holes passing through the aperture ring along the longitudinal axis A-A' which are spaced apart by an approximately equal angular distance between adjacent gas outlets in radial and angular alignment with endpoints of the plurality of gas channels 120.

The number of gas outlets 128 is to provide a gas flow that is substantially equal about the annular circumference of the aperture ring 125. As an example, the plurality of gas outlets 128 includes at least 15 through holes, and preferably 16 to mate with each of the 16 endpoints of the gas channels 120. The diameter of each of the plurality of gas outlets 128 should be approximately equal and sized for a pressure drop which will provide a gas flow that is substantially equal about the annular circumference of the aperture ring 125. As an example, where the plurality of gas outlets 128 includes 16 through holes, each through hole having a diameter of approximately 3.0 millimeter. For embodiments including the shim 122, the shim 122 to seal a union between each of the gas channels and gas outlets.

Referring to FIG. 1, the aperture ring 125 further includes an inner aperture flange 130 extending radially inward from the plurality of gas outlets 128 (e.g., disposed at a radial distance $R_3$) to an inner radial distance $R_4$. As further illustrated in cross-section by FIG. 3, when assembled about the sputter target 201, the inner aperture flange 130 is dimensioned to overlap the sputter target 201 to protect a target re-deposition area. A target clamp 210 is also overlapped by the inner aperture flange 130 which helps to prevent target clamp material from being sputtered onto the workpiece. The amount by which the inner aperture flange 130 overlaps the sputter target 201 (e.g., sputter target radius $R_6$–inner radial distance $R_4$) is dependent on whether the sputter target 201 is of the bonded or non-bonded variety. Exemplary overlap is approximately 2.5 millimeter for a bonded sputter target and approximately 10 millimeter for a non-bonded sputter target.

Figure 4A:
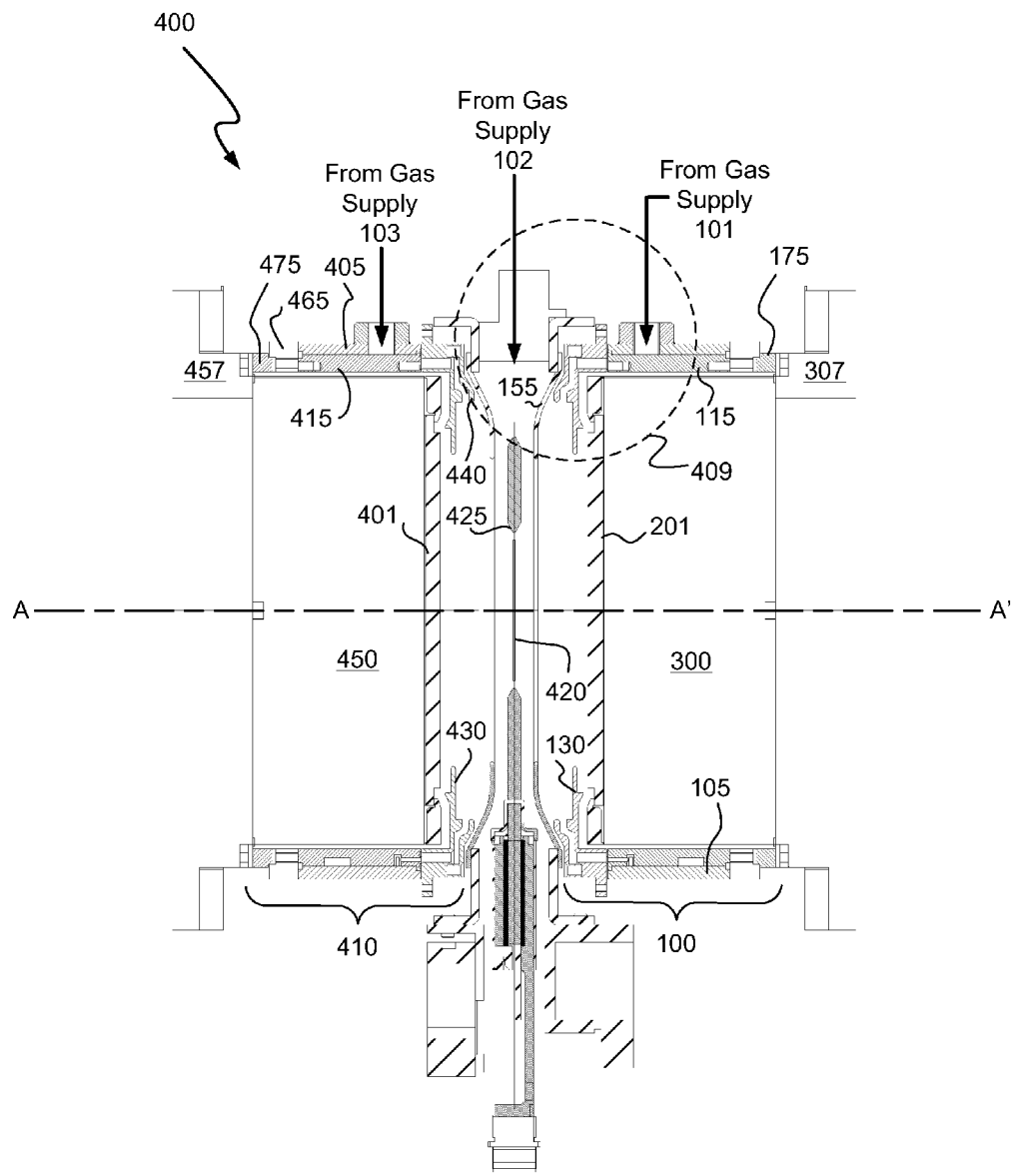
FIG. 4A illustrates a cross-section view of a sputter deposition chamber including a plurality of shield assemblies, in accordance with an embodiment of the present invention.
Figure 4B:
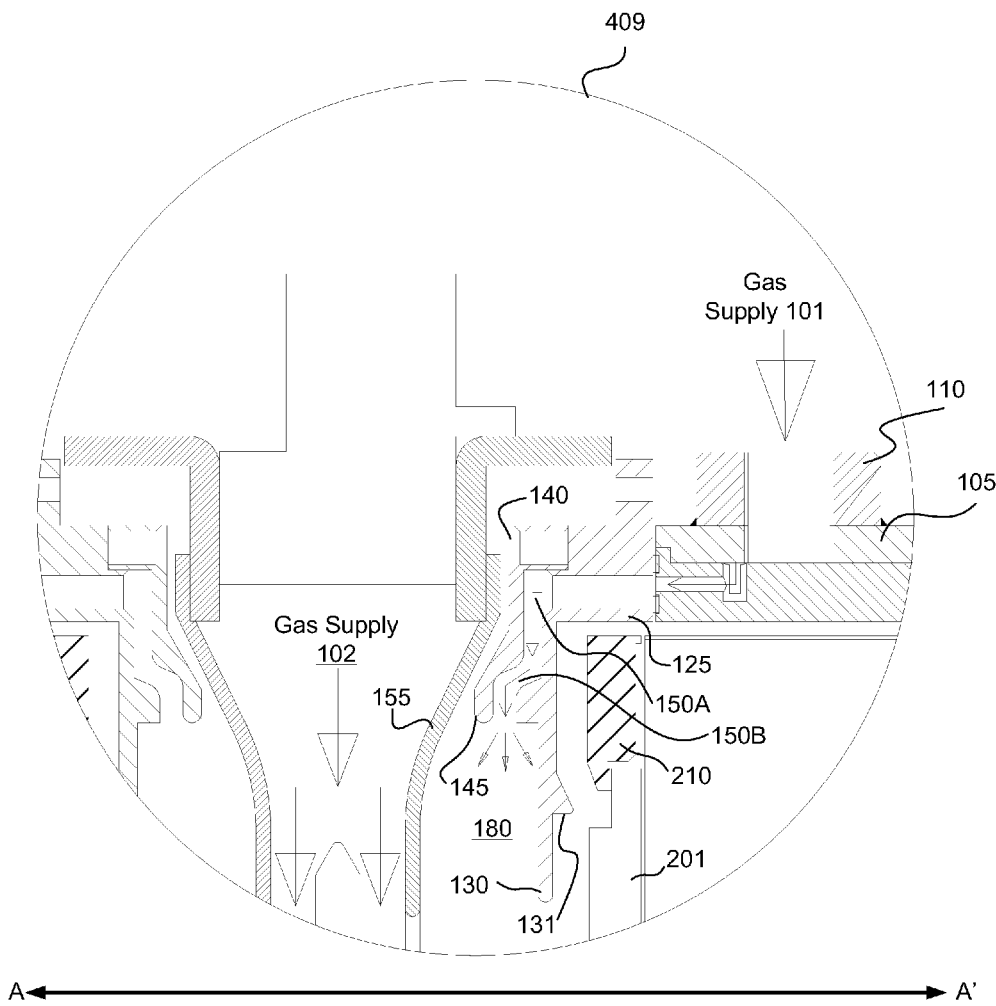
FIG. 4B illustrates an expanded view of a portion of the sputter deposition chamber depicted in FIG. 4A.

FIG. 4A illustrates a cross-section view of an exemplary sputter deposition chamber 400 including the shield assembly 300 (from FIG. 3) while FIG. 4B illustrates an expanded view of the portion 409 depicted in FIG. 4A. As shown in FIG. 4B, along the radial overlap, the inner aperture flange 130 has a first surface 131 which follows the topology of an opposing surface of the sputter target 201 and/or the target clamp 210 to maintain a sufficiently small gap spacing, in the direction of the longitudinal axis A-A', that redeposition is mitigated. Exemplary gap spacings between the sputter target 201 and the first surface 131 are from approximately 3.0 millimeter (mm) to approximately 4.5 millimeter (mm). As described further elsewhere herein, this gap spacing between the inner aperture flange first surface 131 and the sputter target 201 may be controlled by one or more components of the assembly 100 to accommodate various sputter target thicknesses and chamber mounting arrangements that may vary between different sputter deposition systems.

Returning to FIG. 1, the shield assembly 100 includes a gas shield ring 140 having an annular shape with a first face 141 adjacent to a second face 127 of the aperture ring 125. As the interface between the gas shield ring 140 and the aperture ring 125 need not be gas-tight, the first gas shield ring face 141 may simply abut the aperture ring second face 127. For the exemplary embodiment illustrated in FIG. 3, the gas shield ring 140 includes a gas shield flange 145 adjacent to the inner aperture flange 130 to form a gas runway 150 for conducting the gas from the plurality of gas outlets 128 generally toward the sputter target 201 and more specifically toward the longitudinal axis A-A' of the shield assembly. The gas runway 150 is circumferentially continuous and may be sized to better control the gas flow direction and rate as a function of angular position. In the exemplary embodiments where each of the plurality of gas outlets 128 have a diameter of approximately 3.0 mm, the gas shield flange 145 is formed to correspond to the shape of the inner aperture flange 130 to size the gas runway 150 to between 2.5 and 3.0 millimeters (mm), in a dimension parallel the longitudinal axis A-A'.

As further shown in FIG. 4B, because the gas shield ring 140 is affixed at a radial distance greater than the radial distance of the plurality of the gas outlets 128, the gas shield flange 145 forms an elbow 150A with the inner aperture flange 130 to direct the gas from a direction predominantly parallel to the longitudinal axis A-A' into a direction predominantly radial toward the longitudinal axis A-A'. In certain embodiments, the gas runway 150 is formed via the surface topologies of the opposing surfaces of the gas shield ring 140 and inner aperture flange 130 to limit the line of sight to from the elbow 150A to be less than the radial length of the gas runway 150 to reduce accumulation of deposits (e.g., oxides of the sputter target material) at each of the plurality of gas outlets 128. In the exemplary embodiment illustrated in FIG. 4B, the gas runway 150 includes an s-curve 150B to limit a line of sight length.

Referring to FIG. 4A, in the exemplary embodiment, the gas shield flange 145 has a shorter radial length than the radial length of the inner aperture flange 130 (i.e., the inner radius $R_6$ is larger than the inner radius $R_4$) to conduct the gas from the gas runway to a region between the inner aperture flange 130 and a center shield 155. The center shield 155, as known in the art, is positioned about a workpiece 420 and a carrier 425 when each is disposed within the sputter chamber 400 during processing. Referring to FIG. 4B, with the inner aperture flange 130 having a shorter radial length, laminar gas flow may be provided in the chamber region 180 between the inner aperture flange 130 and the center shield 155 to further reduce particulate condensation during processing.

Returning to FIG. 1, the shield assembly 100 further includes supporting members to provide for rear clamping of the gas shield ring 140, aperture ring 125, inner sleeve 115 and outer sleeve 105 to a cathode support. In the exemplary embodiment, a rear clamp 165 has a first face 166 disposed adjacent to a second end of both the inner and outer sleeves 115, 105 to couple the sleeves together. The rear clamp 165 clamps the two sleeves together to avoid any need for mounting holes between the outer sleeve 105 and inner sleeve 115. Of course, alternative configurations which may still provide reduced particulate formation are also possible where mounting holes between the inner and outer sleeves are utilized. In preferred rear clamping embodiments, a gas-tight seal is provided at the interface between the rear clamp 165 and inner and outer sleeves 115, 105; either by an o-ring seated in the rear clamp 165 between the rear clamp first face 166 and a second end of both the inner and outer sleeves (e.g., second face 118 illustrated in FIG. 1), or by other means known in the art to prevent gas leaks.

Also illustrated in FIG. 1, embodiments of the shield assembly 100 further include a shield attachment ring 175 to be coupled to a second face 167 of the rear clamp 165 to couple the shield assembly 100 to a cathode 307 (as illustrated in FIG. 3). In particular embodiments, the shield attachment ring is a magnetized material, such as high carbon stainless steel, such that the assembly 100 may be magnetically affixed to the cathode 307.

As previously discussed, a gap spacing between the inner aperture flange 130 and the sputter target 201 is controlled to close tolerances to prevent redeposition, of target material, etc. Embodiments incorporating a spacer 170 (FIGS. 1, 2 and 3) between opposing faces of the rear clamp 165 and shield attachment ring 175 allow the various other members of the shield assembly 100 (e.g., inner and outer sleeves 115, 105, aperture ring 125, gas shield ring 140, etc.) to remain fixed to predetermined dimensions while allowing for control over the gap spacing between the inner aperture flange 130 and the sputter target 201. Spacers of differing thickness along the longitudinal axis A-A' enable dimensions of all the other components in the shield assembly 100 to remain standardized and constant across different deposition chamber generations, configurations, designs, and different sputter target thicknesses while still achieving the desired gap spacing. For example, for a first deposition chamber, a spacer 170 having a thickness of 1.5 mm may be appropriate to stand the inner aperture flange 130 off a surface of the target 201 by approximately 3.0 mm. For a second deposition chamber having a slightly different hardware configuration than the first deposition chamber, that same spacer thickness may stand the inner aperture flange 130 off a surface of the target 201 by approximately 4.5 mm. Depending on the level of control required therefore, various spacer thicknesses may be utilized to stand the inner aperture flange 130 off a surface of the target 201 by a desired and constant amount (e.g., between 3.0 mm and 4.5 mm) independent of other deposition system hardware.

In embodiments, a deposition chamber includes a plurality of shield assemblies with each of the shield assemblies fitted about a separate, opposing sputter target. Referring to FIG. 4A, the exemplary deposition chamber 400 includes the shield assemblies 100 and 410 facing opposite sides of the workpiece 420. The shield assembly 410 is affixed to the cathode 457 and fitted about the sputter target 401, while the shield assembly 100 is affixed to the cathode 307 and fitted about the sputter target 201, as previously described for FIGS. 1, 2, and 3. In embodiments, the shield assembly 410 includes all the components as the shield assembly 100 to provide the same advantages of reduced particulate formation upon introduction of reactive gas from the gas supply 103 as the shield assembly 100 provides upon introduction of reactive gas from the gas supply 101. In particular, the second shield assembly 410 includes inner and outer sleeves 415,405, aperture ring 430, gas shield ring 440, rear clamp 465, spacer 470 and shield attachment ring 175, with each being a counterpart to the components described in the context of shield assembly 100. In further embodiments the chamber 400 includes an additional shield assembly for each additional sputter target operable during a sputter deposition process. For example, where a plurality of workpieces are to be processed concurrently, additional pairs of shield assemblies (not depicted) analogous to the pair of shield assemblies 100, 410 depicted in FIG. 4A may be included within a single deposition chamber. In other embodiments, where a single deposition chamber includes a plurality of targets operated either concurrently (e.g., for co-sputtering) or in the alternative (e.g., for multi-use deposition chambers), a shield assembly substantially as described for shield assembly 100 may be provided for each target.

As further illustrated in FIGS. 4A and 4B, during a sputter deposition process, multiple gas supplies may be provided concurrently or successively. In the exemplary embodiment, the gas supply 101, which includes a reactive gas species is introduced through the shield assembly 100 (as further depicted in FIG. 2) into the deposition chamber 400 concurrently with a gas from the gas supply 102 introduced to the deposition chamber 400 externally from the shield assembly 100. Typically, the gas supply 102 will only comprise a non-reactive working gas, such as argon, and therefore particulate formation is not a concern at the inlet aperture for the gas supply 102. In the exemplary embodiment, where the deposition chamber 400 is to deposit a magnetic alloy material onto the workpiece 420, the gas supply 101 includes oxygen and is preferably diluted with a neutral working gas, such as argon, while argon alone is introduced from the gas supply 102. In further embodiments, the gas supply 103 also includes a dilute oxygen mixture ($Ar:O_2$) to reactively sputter material from the sputter target 401 onto a second side of the workpiece 402. As such, reactive gas species from gas supplies 101 and 103 are introduced in closer proximity to the sputter targets 201, 401 than is the non-reactive gas from gas supply 102. Even with a relatively low partial pressure of oxygen during a sputter deposition process, the multiple reactive gas supplies 101, 103, as distributed by the shield assemblies 100 and 410, provide for good uniformity of reactive gas species proximate to the surfaces of the sputter targets 201 and 401, respectively.

Figure 5:
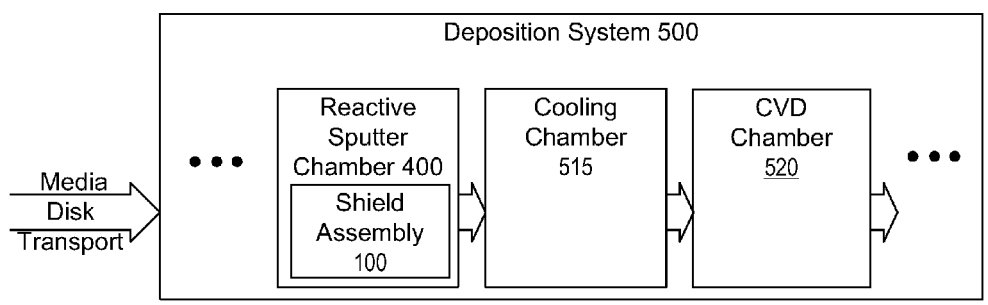
FIG. 5 illustrates a block diagram of an automated deposition system 500 for manufacturing magnetic recording media disks, in accordance with an embodiment of the present invention.

FIG. 5 illustrates a block diagram of an automated deposition system 500 for manufacturing magnetic recording media disks, in accordance with an embodiment of the present invention. The deposition system 500 may be any system known in the art, such as a static deposition system available from manufacturers such as Intevac Inc. of Santa Clara, Calif. and Canon-Anelva Corp. of Japan or an in-line sputtering deposition system available from manufacturers such as Ulvac Corp. of Japan. The deposition system 500 includes a plurality of deposition chambers. Various ones of the deposition chambers may be of any type known in the art, such as, but not limited to, a sputter deposition chamber, an ion beam deposition chamber, a molecular beam deposition chamber, and a chemical vapor deposition (CVD) chamber. However, in the exemplary embodiment, the deposition system 500 includes at least the sputter deposition chamber 400, which in a specific embodiment is configured to perform a reactive sputter deposition process to deposit a magnetic recording layer. The deposition chamber 400, as further described in reference to FIGS. 4A and 4B includes at least one shield assembly, as further described in reference to FIGS. 1, 2, and 3. In further embodiments, one or more additional sputter deposition chambers may be included in the deposition system 500, any of which may also perform a reactive sputter deposition process and any of which may further include shield assemblies as described herein. In the exemplary embodiment depicted in FIG. 5, the deposition system 500 includes a CVD chamber 520 configured to deposit a carbon overcoat on a workpiece (e.g., a magnetic recording media disk substrate) subsequent to one or more reactive sputter deposition processes. The deposition system 500 further includes a cooling chamber 515 to cool the workpiece subsequent to one or more reactive sputter deposition processes.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

The invention claimed is:

1. A shield assembly for a sputter deposition chamber, the shield assembly comprising:
   an outer sleeve with a gas inlet to conduct a gas through the outer sleeve;
   an inner sleeve disposed within the outer sleeve, the inner sleeve including gas channels on a surface mating with the outer sleeve to conduct the gas between the inner and outer sleeves;
   an aperture ring having a first face adjacent to a first end of both the inner and outer sleeves, the aperture ring including a plurality of gas outlets to conduct the gas from the gas channels and further including an inner aperture flange extending from the plurality of gas outlets to an inner radial distance; and
   a gas shield ring having a first face adjacent to a second face of the aperture ring, the gas shield ring including a gas shield flange adjacent to the inner aperture flange to form a gas runway for conducting the gas from the plurality of gas outlets toward a longitudinal axis of the shield assembly.

2. The shield assembly of claim 1, wherein the inner and outer sleeves form a gas manifold with the gas channels distributing the gas to the plurality of gas outlets.

3. The shield assembly of claim 1, wherein the plurality of gas outlets comprise a plurality of through holes passing through the aperture ring along the longitudinal axis and spaced apart by an approximately equal angular distance between adjacent gas outlets.

4. The shield assembly of claim 3, wherein the through holes have a diameter of approximately 3.0 millimeters (mm) and wherein the plurality comprises at least 15 through holes.

5. The shield assembly of claim 1, wherein the gas shield flange has a shorter radial length than that of the inner aperture flange to conduct the gas from the gas runway to a space between the inner aperture flange and a center shield to be positioned about a workpiece disposed within the sputter chamber.

6. The shield assembly of claim 1, wherein the gas runway is sized to between 2.5 and 3.0 millimeters (mm) along the longitudinal axis.

7. The shield assembly of claim 1, wherein the gas channels distributing the gas to the plurality of gas outlets form a binary branching arrangement with each upper level of the branching arrangement have a smaller channel size than a level below.

8. The shield assembly of claim 1, further comprising:
   a rear clamp having a first face adjacent to a second end of both the inner and outer sleeves to couple the inner and outer sleeves together.

9. The shield assembly of claim 8, further comprising an o-ring disposed between the first face of the rear clamp and a second end of both the inner and outer sleeves.

10. The shield assembly of claim 8, further comprising:
    a shield attachment ring coupled to a second face of the rear clamp to couple the shield assembly to a cathode of the sputter chamber.

11. The shield assembly of claim 10, further comprising:
    a spacer ring disposed between the rear clamp and shield attachment ring to stand the aperture flange off a target surface by between approximately 3.0 mm and approximately 4.5 mm.

12. The shield assembly of claim 1, further comprising:
    a metallic shim disposed between the first face of the aperture ring and the first end of the inner and outer sleeves to seal a union between the gas channels and gas outlets.

13. The shield assembly of claim 12, wherein the inner and outer sleeves and aperture ring comprise aluminum and wherein the metallic shim comprises copper.

14. A sputter deposition chamber comprising:
    a cathode;
    a first sputter target; and
    a first shield assembly coupled to the cathode, wherein the first shield assembly further comprises:
       a first outer sleeve including a first gas inlet to conduct a first gas through the first outer sleeve;
       a first inner sleeve disposed within the first outer sleeve, the first inner sleeve including first gas channels on a surface mating with the first outer sleeve to conduct the gas between the first inner and outer sleeves;
       a first aperture ring having a first face adjacent to a first end of both the first inner and outer sleeves, the first aperture ring including a first plurality of gas outlets to conduct the first gas from the first gas channels and further including a first inner aperture flange extending from the first plurality of gas outlets to an inner radial distance; and a first gas shield ring having a first face adjacent to a second face of the first aperture ring, the first gas shield ring including a first gas shield flange adjacent to the second inner aperture flange to form a second gas runway for conducting the first gas from the first plurality of gas outlets toward a longitudinal axis of the first shield assembly.

15. The sputter deposition chamber as in claim 14, further comprising:

a second sputter target disposed opposite the first sputter target with a space there between to accommodate a workpiece, wherein the second sputter target is surrounded by a second shield assembly, wherein the second shield assembly further comprises:
  a second outer sleeve including a second gas inlet to conduct a second gas through the second outer sleeve;
  a second inner sleeve disposed within the second outer sleeve, the second inner sleeve including second gas channels on a surface mating with the second outer sleeve to conduct the gas between the second inner and outer sleeves;
  a second aperture ring having a first face adjacent to a first end of both the second inner and outer sleeves, the second aperture ring including a second plurality of gas outlets to conduct the second gas from the second gas channels and further including a second inner aperture flange extending from the second plurality of gas outlets to the inner radial distance; and
  a second gas shield ring having a first face adjacent to a second face of the second aperture ring, the second gas shield ring including a second gas shield flange adjacent to the second inner aperture flange to form a second gas runway for conducting the second gas from the second plurality of gas outlets toward a longitudinal axis of the second shield assembly.

16. The sputter deposition chamber as in claim 14, wherein the first gas inlet is coupled to first gas supply comprising oxygen to reactively sputter the first sputter target.

17. The sputter deposition chamber as in claim 14, wherein the first gas supply further comprises argon and wherein the sputter deposition chamber is further coupled to a second gas supply external to the first shield assembly.

18. The sputter deposition chamber as in claim 14, wherein the first sputter target comprises a magnetic metallic alloy to form a magnetic recording layer on a workpiece positioned within the sputter chamber.

19. The sputter deposition chamber as in claim 14, wherein the inner and outer sleeves form a gas manifold with the gas channels distributing the gas to the plurality of gas outlets.

20. A sputter deposition apparatus including a plurality of sputter deposition chambers, wherein the plurality of deposition chambers comprises the sputter deposition chamber as in claim 14.

* * * * *